(12) United States Patent
Lan et al.

(10) Patent No.: US 6,645,825 B1
(45) Date of Patent: Nov. 11, 2003

(54) PLANARIZATION OF SHALLOW TRENCH ISOLATION (STI)

(75) Inventors: Chin Kun Lan, Hsin-Chu (TW); Ting Chun Wang, Tao-Yen (TW); Tong-Hua Kuan, Hsin-Chu (TW); Ying-Lang Wang, Tai-Chung (TW)

(73) Assignee: Taiwan Semiconductor Manufacturing Company, Hsin-chu (TW)

( * ) Notice: Subject to any disclaimer, the term of this patent is extended or adjusted under 35 U.S.C. 154(b) by 172 days.

(21) Appl. No.: 09/614,554

(22) Filed: Jul. 12, 2000

(51) Int. Cl.$^7$ ................................. H01L 21/76
(52) U.S. Cl. ..................... 438/424; 438/221; 438/296; 438/437; 438/692; 257/506; 257/510
(58) Field of Search ................... 438/221, 296, 438/424, 426, 435, 437, 692; 257/506, 510

(56) References Cited

U.S. PATENT DOCUMENTS

| | | | |
|---|---|---|---|
| 5,736,462 A | 4/1998 | Takahashi et al. | 438/692 |
| 5,942,449 A | 8/1999 | Meikle | 438/747 |
| 6,080,670 A | * 6/2000 | Miller et al. | 438/691 |
| 6,087,262 A | * 7/2000 | Yang et al. | 438/692 |

* cited by examiner

*Primary Examiner*—Charles Bowers
*Assistant Examiner*—Hsien-Ming Lee
(74) *Attorney, Agent, or Firm*—George O. Saile; Stephen B. Ackerman

(57) ABSTRACT

An improved and new process for fabricating a planarized structure of shallow trench isolation (STI) embedded in a silicon substrate has been developed. The planarizing method comprises a two-step CMP process in which the first CMP step comprises chemical-mechanical polishing of silicon oxide using a first polishing slurry which is selective to silicon oxide. The time of the second CMP step is determined by selecting an overpolish thickness based on the percentage of substrate area occupied by the trench. High manufacturing yield and superior planarity for silicon oxide STI are achieved.

13 Claims, 4 Drawing Sheets

PLANARIZATION OF SHALLOW TRENCH ISOLATION (STI)

BACKGROUND OF THE INVENTION (1) Field of the Invention

This invention relates to a method of fabrication used for semiconductor integrated circuit devices, and more specifically to the formation of a planarized structure of shallow trench isolation (STI) embedded in a semiconductor substrate.

(2) Description of Related Art

As semiconductor integrated circuits progress toward greater micro-miniaturation, active devices are packed into ever smaller areas and electrical isolation between active devices becomes an extremely important issue. Shallow trenches filled with insulating material have proven to be most desirable for isolating active devices. At the same time in the fabrication of semiconductor integrated circuits, substrate surface planarity is of extreme importance and CMP (Chemical Mechanical Polishing) has been developed to produce smooth topographies on surfaces deposited on semiconductor substrates. When CMP (Chemical Mechanical Polishing) is applied to trench isolation technology the CMP process removes insulating material from the surface of the active semiconductor areas and retains insulating material in the trenches. However, various combinations of trench width and active area width occur across the surface of the semiconductor substrate and these factors affect the uniformity of removal of the CMP process. Furthermore, variations in circuit density cause variations in percentages of substrate area occupied by trenches and by active semiconductor. Because of these varying pattern densities, a sufficient degree of uniform planarization sometimes is not achieved by state-of-the-art CMP processes. Therefore, a challenge in the industry is to provide a means of formation of planarized isolation trenches, where such trench fill process and planarization process result in the desired uniformity and have both minimal cost and high manufacturing yield.

U.S. Pat. No. 5,942,449 entitled "Method for Removing An Upper Layer Of Material From A Semiconductor Wafer" granted Aug. 24, 1999 to Scott G. Meikle describes a two-step method of removing and planarizing a layer on a semiconductor substrate, in which the first step removes a substantial portion of the layer by a chemical etching process and the second step removes the remaining portion of the layer by a CMP process which simultaneously planarizes the layer.

U.S. Pat. No. 5,736,462 entitled "Method Of Etching Back Layer On Substrate" granted Apr. 7, 1998 to Hiroshi Takahashi et al. describes a method of endpoint detection for CMP (Chemical Mechanical Polishing) whereby an intermediate layer under the layer being polished has a larger or smaller polish rate. A signal derived from the polishing tool detects when this intermediate layer is being polished and this signal is used to determine CMP endpoint.

The present invention is directed to a novel method of controlling CMP (Chemical Mechanical Polishing) of STI (Shallow Trench Isolation), which results in improved planarization uniformity. The method of the present invention requires less CMP processing time, has lower cost than conventional CMP methods and produces a polished surface having superior planarity.

SUMMARY OF THE INVENTION

It is a general object of the present invention to provide an improved method of forming planarized isolation trenches for use in semiconductor integrated circuits.

A more specific object of the present invention is to provide an improved method of forming planarized isolation trenches for use in semiconductor integrated circuits, wherein the chemical-mechanical polishing process results in superior planarization uniformity.

Another object of the present invention is to provide an improved method of forming planarized isolation trenches for use in semiconductor integrated circuits, wherein the chemical-mechanical polishing process results in superior planarization uniformity, has high manufacturing yield and low manufacturing cost.

In accordance with the present invention, the above and other objectives are realized by using a method of fabricating a planarized structure on a semiconductor substrate, wherein an insulating material is embedded in a trench formed in the semiconductor substrate, the method comprising the following steps: providing a semiconductor substrate having a layer of silicon nitride formed thereon and at least one trench formed through the layer of silicon nitride and into the semiconductor substrate; depositing a layer of insulating material onto said layer of silicon nitride and into said at least one trench formed through the layer of silicon nitride and into the semiconductor substrate; chemical-mechanical polishing the layer of insulating material by a first CMP step comprising chemical-mechanical polishing until exposure of said silicon nitride layer is detected by an endpoint detecting device; selecting an overpolish thickness based on the percentage of substrate area occupied by said trench; and chemical-mechanical polishing the layer of insulating material by a second CMP step which removes said overpolish thickness based on the percentage of substrate area occupied by said trench.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

The new and improved method of using a two-step CMP process to form planarized structure of shallow trench isolation (STI) embedded in a semiconductor substrate will now be described in detail.

Figure 1A:
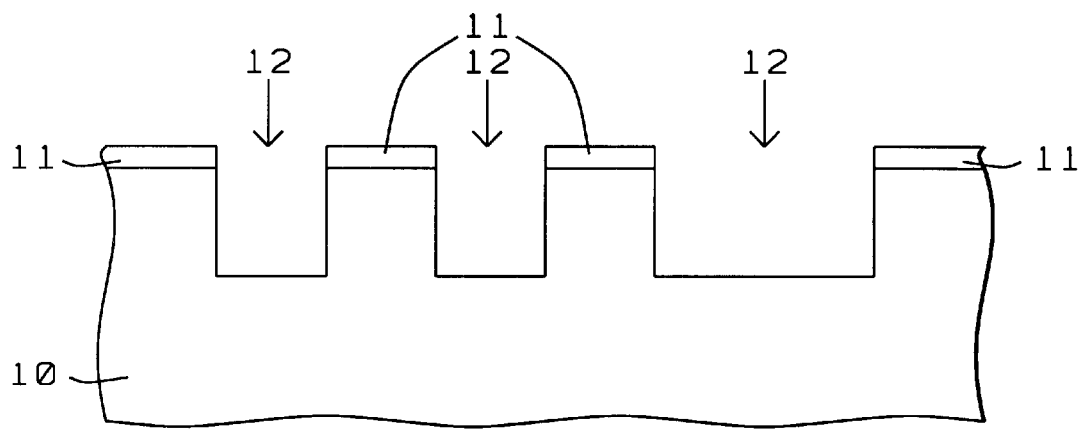
FIGS. 1A–1D, which in cross-sectional representation illustrate the method of the present invention.

Referring to FIG. 1A, semiconductor substrate 10 has a layer of silicon nitride 11 deposited thereon and trenches 12 etched through the layer of silicon nitride 11 and into the semiconductor substrate 10. The semiconductor substrate 10 is preferably single crystal silicon. The layer of silicon nitride 11 has a thickness between about 1500 and 1800 Angstroms. The trenches 12 have widths between about 0.3 and 200 microns and a depth between about 3000 and 4000 Angstroms.

Figure 1B:
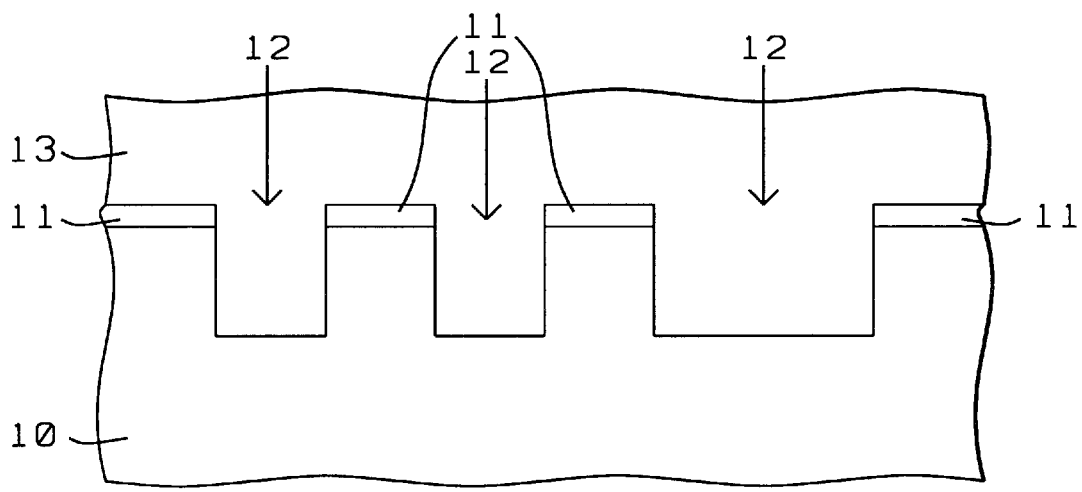
Figure 2:
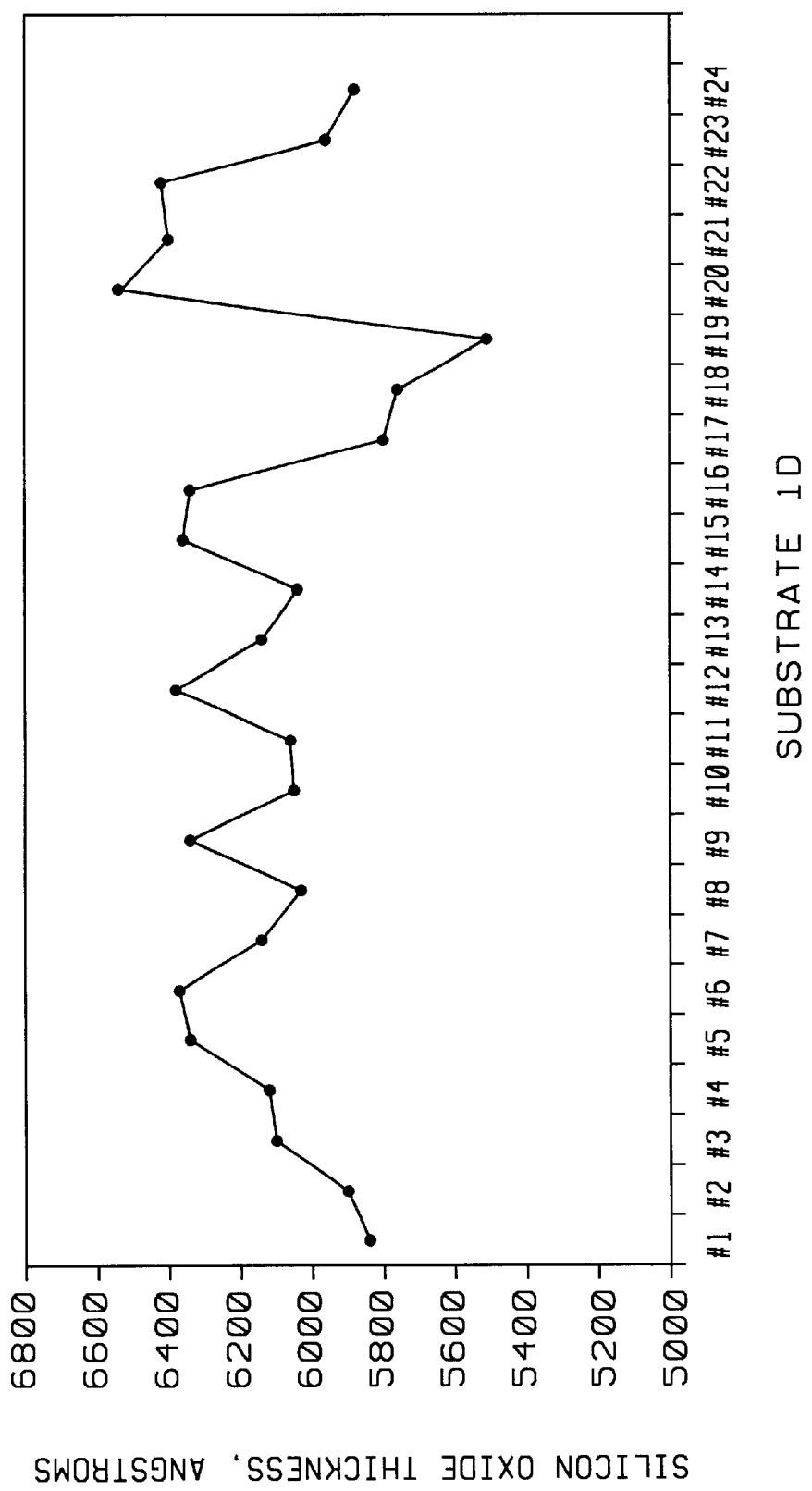
FIG. 2 shows the variation of as deposited silicon oxide thickness for processed substrates.

Next, as shown in FIG. 1B, insulating material 13 is deposited onto the layer of silicon nitride 11 and into the trenches 12. The preferred insulating material is silicon oxide deposited by a high density plasma (HDP) deposition process, followed by in situ ion bombardment with inert ions comprising argon ions, other noble gas ions, or mixtures thereof. After deposition, the silicon oxide has a thickness in the range between about 5500 and 6600 Angstroms. The combination of HDP and in situ argon ion bombardment yields reduced silicon oxide peaks over the silicon nitride, but control of the final thickness of silicon oxide is difficult because of inherent deposition variability of the HDP deposition process and inherent etchback variability of the inert gas bombardment process. The result is considerable substrate-to-substrate variation of silicon oxide thickness following deposition. FIG. 2 shows this variation in deposited silicon oxide thickness for a series of twenty-four substrates. When the target thickness is 6000 Angstroms the mean silicon oxide thickness is about 6000±600 Angstroms. This variation in as-deposited silicon oxide thickness makes subsequent planarization of the silicon oxide by conventional CMP (chemical-mechanical polishing) difficult to control without the necessity for costly and time consuming off-line thickness measurements. Control of the CMP process by time takes into account neither this variation in as-deposited silicon oxide thickness nor the variation of polish removal rate due to polish pad wearout and is, therefore inadequate for CMP control. Improvement of control of the CMP process is possible by using CMP removal rate as the controlling parameter, but this method requires frequent costly off-line thickness measurements on process monitor substrates as well as costly off-line measurement of the as-deposited silicon oxide thickness on individual substrates. Therefore, control of the CMP process by monitoring the CMP removal rate is unacceptable for manufacturing because of the considerable cost and reduced throughput for the manufacturing line. State-of-the-art endpoint detection methods have shown promise as control means for CMP removal processes, but have not yielded adequate results for shallow trench isolation (STI) planarization processes. For example, when using endpoint detection means to control a silicon oxide CMP process the CMP process is followed by an overpolish time which is usually a fixed percentage of the polish time to endpoint. The overpolish time is intended to compensate for variation in as-deposited silicon oxide thickness and non-uniformity of the CMP removal process across the substrate. This CMP control method is not adequate when using CMP to planarize shallow trench isolation (STI) embedded in a semiconductor substrate and results in unacceptable variation of silicon oxide thickness across the substrate subsequent to the CMP process. For example, the post-CMP thickness and variation achieved by this control method is 4100±500 Angstroms.

Figure 1C:
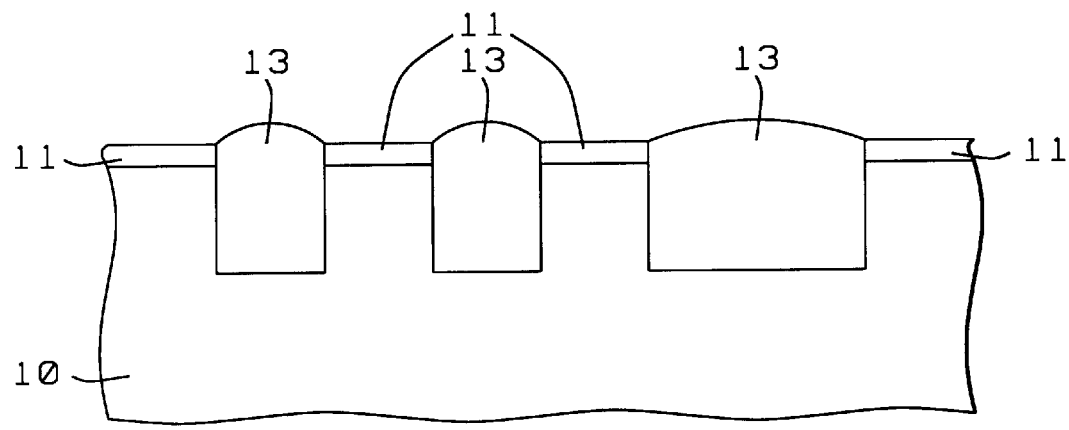
Figure 1D:
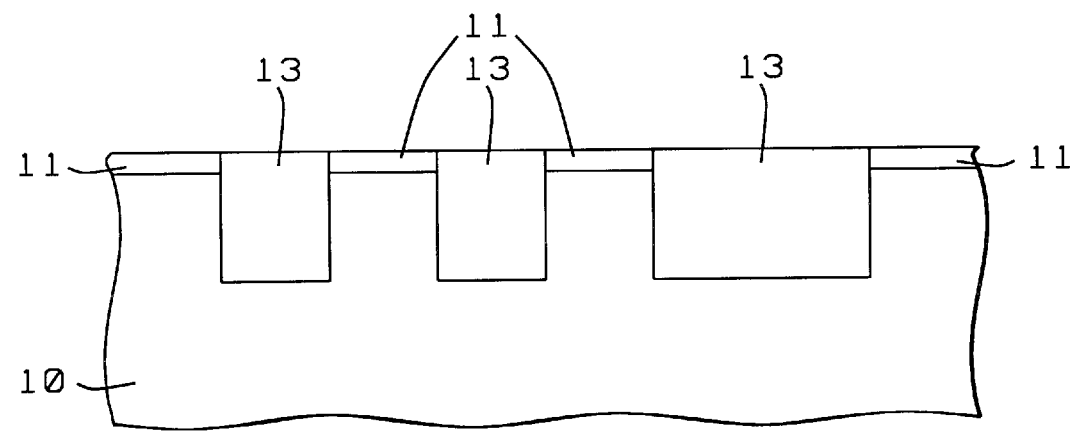
Figure 3:
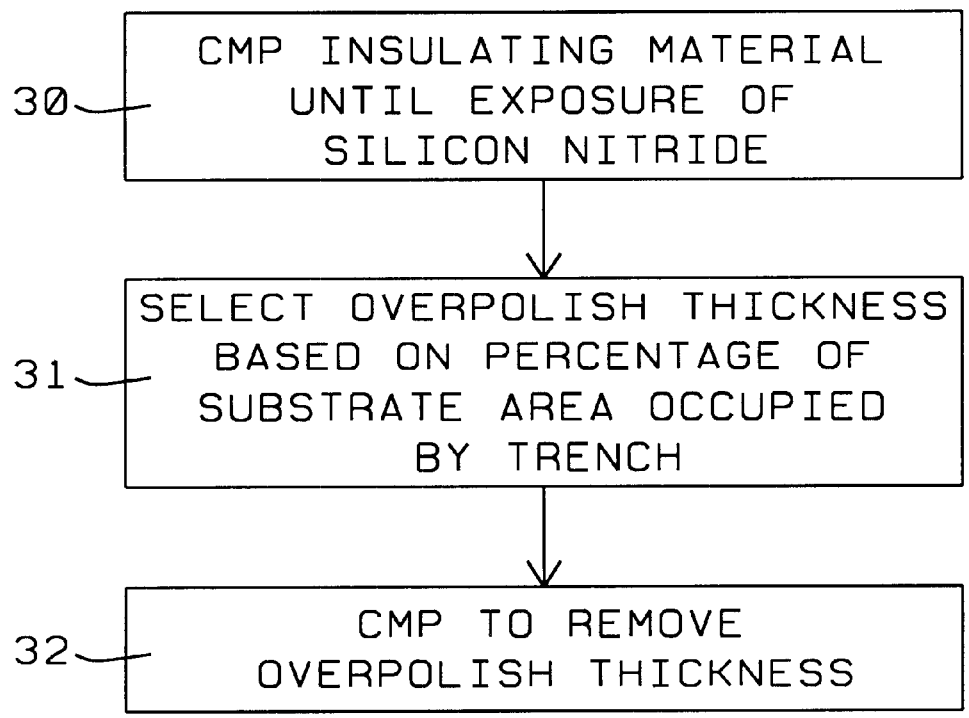
FIG. 3 is a flow chart of the method of the preferred embodiment of the present invention.

The present invention discloses a new two-step CMP process for forming planarized insulator-filled trenched embedded in a semiconductor substrate covered with a silicon nitride layer. The key feature of the new process is chemical-mechanical polishing the layer of insulating material by a two-step process, the first CMP step comprising chemical-mechanical polishing, using a slurry comprising fumed silica, until exposure of the silicon nitride layer is detected by an endpoint detecting device; then selecting an overpolish thickness based on the percentage of substrate area occupied by the trench; and finally chemical-mechanical polishing, using a slurry comprising fumed silica, the layer of insulating material by a second CMP step which removes the overpolish thickness based on said percentage of substrate area occupied by the trench. By using this two-step CMP process, where following endpoint detection for the first CMP step the time for the second step, an overpolish step, selected based on the percentage of substrate area occupied by said trench the achieved post-CMP thickness and variations is 4100±150 Angstroms. The first step of the two-step CMP process is depicted in FIG. 1C, showing exposure of the silicon nitride layer 11 and incomplete planarization of insulating material 13. FIG. 1D depicts the STI structure following the second step of the two-step CMP process; here planarized insulating material 13 is embedded in semiconductor substrate 10. The process flow is illustrated in FIG. 3, where Step 30 is the first CMP step comprising chemical-mechanical polishing until exposure of said silicon nitride layer is detected by an endpoint detecting device; Step 31 is selection of an overpolish thickness based on the percentage of substrate area occupied by said trench; and Step 32 is a second CMP step which removes said overpolish thickness based on the percentage of substrate area occupied by said trench.

While the invention has been particularly shown and described with reference to the preferred embodiments thereof, it will be understood by those skilled in the art that various changes in form and details may be made without departing from the spirit and scope of the invention.

What is claimed is:

1. A method of fabricating a planarized structure on a semiconductor substrate, wherein an insulating material is embedded in a trench formed in the semiconductor substrate, the method comprising the steps of:

providing a semiconductor substrate having a layer of silicon nitride formed thereon and at least one trench formed through the layer of silicon nitride and into the semiconductor substrate;

depositing a layer of insulating material onto said layer of silicon nitride and into said at least one trench formed through the layer of silicon nitride and into the semiconductor substrate;

chemical-mechanical polishing the layer of insulating material by a first CMP step comprising chemical-mechanical polishing until exposure of said silicon nitride layer is detected by an endpoint detecting device;

selecting an overpolish thickness based on the percentage of substrate area occupied by said trench; and chemical-mechanical polishing the layer of insulating material by a second CMP step which removes said overpolish thickness based on the percentage of substrate area occupied by said trench.

2. The method of claim 1, wherein said layer of insulating material is silicon oxide.

3. The method of claim 2, wherein said silicon oxide is deposited by a high density plasma deposition process, followed by in situ ion bombardment with inert ions comprising argon ions, other noble gas ions, or mixtures thereof.

4. The method of claim 3, wherein said silicon oxide has a thickness in the range between about 5500 and 6600 Angstroms.

5. The method of claim 1, wherein said first CMP step comprises chemical-mechanical polishing using a slurry comprising fumed silica.

6. The method of claim 1, wherein said overpolish thickness based on the percentage of substrate area occupied by said trench is linearly dependent on the percentage of substrate area occupied by said trench.

7. The method of claim 1, wherein said second CMP step comprises chemical-mechanical polishing using a slurry comprising fumed silica.

8. A method of fabricating a planarized structure on a silicon substrate, wherein silicon oxide is embedded in a trench formed in the silicon substrate, the method comprising the steps of:

providing a silicon substrate having a layer of silicon nitride formed thereon and at least one trench formed through the layer of silicon nitride and into the silicon substrate;

depositing a layer of silicon oxide onto said layer of silicon nitride and into said at least one trench formed through the layer of silicon nitride and into the silicon substrate;

chemical-mechanical polishing the layer of silicon oxide by a first CMP step comprising chemical-mechanical polishing until exposure of said silicon nitride layer is detected by an endpoint detecting device;

selecting an overpolish thickness based on the percentage of substrate area occupied by said trench; and chemical-mechanical polishing the layer of silicon oxide by a second CMP step which removes said overpolish thickness based on the percentage of substrate area occupied by said trench.

9. The method of claim 8, wherein said silicon oxide is deposited by a high density plasma deposition process, followed by in situ ion bombardment with inert ions comprising argon ions, other noble gas ions, or mixtures thereof.

10. The method of claim 8, wherein said silicon oxide has a thickness in the range between about 3950 and 4250 Angstroms.

11. The method of claim 8, wherein said first CMP step comprises chemical-mechanical polishing using a slurry comprising fumed silica.

12. The method of claim 8, wherein said overpolish thickness based on the percentage of substrate area occupied by said trench is linearly dependent on the percentage of substrate area occupied by said trench.

13. The method of claim 8, wherein said second CMP step comprises chemical-mechanical polishing using a slurry comprising fumed silica.

* * * * *